(12) United States Patent
Hiramoto et al.

(10) Patent No.: US 8,514,319 B2
(45) Date of Patent: Aug. 20, 2013

(54) SOLID-STATE IMAGE PICKUP ELEMENT AND IMAGE PICKUP APPARATUS

(75) Inventors: Masao Hiramoto, Osaka (JP); Toshiya Fujii, Shiga (JP); Masaaki Suzuki, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/502,417

(22) PCT Filed: Apr. 22, 2011

(86) PCT No.: PCT/JP2011/002382
§ 371 (c)(1),
(2), (4) Date: Apr. 17, 2012

(87) PCT Pub. No.: WO2012/026051
PCT Pub. Date: Mar. 1, 2012

(65) Prior Publication Data
US 2012/0206637 A1  Aug. 16, 2012

(30) Foreign Application Priority Data
Aug. 24, 2010  (JP) ................................ 2010-187250

(51) Int. Cl.
*H04N 5/225*  (2006.01)
(52) U.S. Cl.
USPC ........................... 348/340; 348/272; 348/335
(58) Field of Classification Search
USPC .............. 348/340, 335, 336, 272; 250/208.1
See application file for complete search history.

(56) References Cited

U.S. PATENT DOCUMENTS 4,670,777 A  6/1987  Ishikawa et al.
4,775,885 A *  10/1988  Sato et al. ..................... 348/280
(Continued)

FOREIGN PATENT DOCUMENTS

JP  61-093787 A  5/1986
JP  63-051437 B  10/1988
(Continued)

OTHER PUBLICATIONS

International Search Report for corresponding International Application No. PCT/JP2011/002382 mailed Jun. 7, 2011.

*Primary Examiner* — Tuan Ho
*Assistant Examiner* — Zhenzhen Wu
(74) *Attorney, Agent, or Firm* — Renner, Otto, Boisselle & Sklar, LLP

(57) ABSTRACT

In a basic pixel arrangement of a solid-state image sensor, a dispersing element is arranged to face each of pixels that are located at row 1, column 2 and row 3, column 1 positions in order to make a light ray with a first color component incident on a horizontally adjacent pixel and also make a light ray with a complementary color component with respect to the first color component incident on that pixel that faces the dispersing element. A dispersing element is arranged to face each of pixels that are located at row 2, column 1 and row 4, column 1 positions in order to make a light ray with a second color component incident on a horizontally adjacent pixel and also make a light ray with a complementary color component with respect to the second color component incident on that pixel that faces the dispersing element. On the other hand, no dispersing elements are arranged to face pixels that are located at row 1, column 1, row 2, column 2, row 3, column 2 and row 4, column 2 positions.

8 Claims, 7 Drawing Sheets

(56) References Cited

U.S. PATENT DOCUMENTS

| | | |
|---|---|---|
| 8,208,052 B2 * | 6/2012 | Hiramoto et al. ............. 348/294 |
| 2007/0097252 A1 * | 5/2007 | Silverstein ................... 348/336 |
| 2010/0019129 A1 * | 1/2010 | Ishigaki et al. ............ 250/208.1 |
| 2010/0176473 A1 | 7/2010 | Nishiwaki |
| 2010/0188537 A1 | 7/2010 | Hiramoto et al. |

FOREIGN PATENT DOCUMENTS

| | | |
|---|---|---|
| JP | 05-153509 A | 6/1993 |
| JP | 06-028450 B | 4/1994 |
| JP | 08-009395 A | 1/1996 |
| JP | 4264465 B | 2/2009 |
| WO | 2009/153937 A1 | 12/2009 |

* cited by examiner (a)

(b)

(a)

(b)

(c)

SOLID-STATE IMAGE PICKUP ELEMENT AND IMAGE PICKUP APPARATUS

TECHNICAL FIELD

The present invention relates to a technique for realizing color representation using a solid-state image sensor.

BACKGROUND ART

Recently, the performance and functionality of digital cameras and digital movie cameras that use some solid-state image sensor such as a CCD and a CMOS (which will be sometimes simply referred to herein as an "image sensor") have been enhanced to an astonishing degree. In particular, the size of a pixel structure for use in a solid-state image sensor has been further reduced these days thanks to rapid development of semiconductor device processing technologies, thus getting an even greater number of pixels and drivers integrated together in a solid-state image sensor. As a result, the resolution of an image sensor has lately increased significantly from about one million pixels to ten million or more pixels in a matter of few years. Meanwhile, the greater the number of pixels in an image sensor, the lower the intensity of the light falling on a single pixel (which will be referred to herein as a "light intensity") and the lower the sensitivity of the camera tends to be.

On top of that, in a normal color camera, a subtractive color filter that uses a pigment as a dye is arranged over each photosensing section of an image sensor, and therefore, the optical efficiency achieved is rather low. In a Bayer color filter, which uses a combination of one red (R) pixel, two green (G) pixels and one blue (B) pixel as a fundamental unit, the R filter transmits an R ray but absorbs G and B rays, the G filter transmits a G ray but absorbs R and B rays, and the B filter transmits a B ray but absorbs R and G rays. That is to say, each color filter transmits only one of the three colors of R, G and B and absorbs the other two colors. Consequently, the light ray used by each color filter is only approximately one third of the visible radiation falling on that color filter.

Meanwhile, methods for reading a signal from an image sensor include a non-interlaced method (which is also called a "progressive method" and) in which pixel signals are read on a row-by-row basis and an interlaced method in which pixel signals are read by scanning every other row. According to the non-interlaced method, a Bayer color filter arrangement is generally used. On the other hand, according to the interlaced method, reported are several color representation techniques that can achieve better sensitivity than the Bayer arrangement in a field accumulation mode that mixes together the signals of two vertically adjacent pixels.

For example, Patent Document No. 1 discloses a technique for increasing the sensitivity and resolution using white (W), green, cyan (Cy) and yellow (Ye) color filters. On the other hand, Patent Document No. 2 discloses a technique for reducing false color signals vertically using white, cyan, yellow and other color filters. Furthermore, Patent Document No. 3 discloses a technique for increasing the color reproducibility using red, green, cyan and yellow color filters. And Patent Document No. 4 discloses a technique for realizing good sensitivity and color reproducibility using magenta (Mg), green, cyan and yellow color filters. The technique disclosed in Patent Document No. 4 is currently the mainstream technique in the field accumulation mode.

Hereinafter, the color representation technique disclosed in Patent Document No. 4 will be described with reference to FIG. 10, which illustrates the basic color arrangement of color filters in the image sensor disclosed in Patent Document No. 4. A color filter array is arranged to face a photosensitive cell array, which uses, as a unit block, eight photosensitive cells (pixels) that are arranged in four rows and two columns, and is made up of four kinds of color filters, namely, magenta (Mg), green (G), cyan (Cy) and yellow (Ye) color filters. Pixel signals are read on a two line basis compliant with the NTSC standard for TV signals. In that case, the combination of pixel signals to be read in the second field is shifted by one line from that of pixel signals that have been read in the first field. The pixel signals in two lines are added together only vertically and their sum is processed as a pixel signal representing one line of the first or second field.

In this example, the intensities of photoelectrically converted signals of the light rays that have been transmitted through the magenta, green, cyan and yellow color filters will be identified by Ms, Gs, Cs and Ys, respectively, and their red and blue components will be identified by Rs and Bs, respectively. In that case, since Ms=Rs+Bs, Cs=Gs+Bs, and Ys=Rs+Gs, the signals representing the $n^{th}$ line of the first field will be multiple iterative pairs of the signals $S_{n,1}$ and $S_{n,2}$ given by the following Equations (1) and (2):

$$S_{n,1} = Ms + Cs = Rs + Gs + 2Bs \tag{1}$$

$$S_{n,2} = Gs + Ys = Rs + 2Gs \tag{2}$$

On the other hand, the signals representing the $(n+1)^{th}$ line of the first field will be multiple iterative pairs of the signals $S_{n+1,1}$ and $S_{n+1,2}$ given by the following Equations (3) and (4):

$$S_{n+1,1} = Ms + Ys = 2Rs + Gs + Bs \tag{3}$$

$$S_{n+1,2} = Gs + Cs = 2Gs + Bs \tag{4}$$

In the second field, these signals are also read in quite the same way. That is to say, the signals representing and $n'^{th}$ and $(n+1)'^{th}$ lines of the second field are also multiple iterative pairs of the signals given by Equations (1) and (2) and multiple iterative pairs of the signals given by Equations (3) and (4), respectively.

A luminance signal YL is generated by adding together signals representing two horizontally adjacent pixels for both of the $n^{th}$ and $(n+1)^{th}$ lines. Also, a color difference signal BY is generated based on the difference between the signals $S_{n,1}$ and $S_{n,2}$ of the $n^{th}$ line and a color difference signal RY is generated based on the difference between the signals $S_{n+1,1}$ and $S_{n+1,2}$ of the $(n+1)^{th}$ line. Consequently, YL, BY and RY are represented by the following Equations (5) to (7):

$$YL = S_{n,1} + S_{n,2} = S_{n+1,1} + S_{n+1,2} = 2Rs + 3Gs + 2Bs \tag{5}$$

$$BY = S_{n,1} - S_{n,2} = 2Bs - Gs \tag{6}$$

$$RY = S_{n+1,1} + S_{n+1,2} = 2Rs - Gs \tag{7}$$

As can be seen, according to the color representation technique disclosed in Patent Document No. 4, good color reproducibility can be achieved by performing such signal arithmetic processing. The sensitivity achieved is also better than a situation where a Bayer arrangement is used because the image sensor of Patent Document No. 4 uses color filters of magenta, cyan and yellow that are complementary colors.

CITATION LIST

Patent Literature

Patent Document No. 1: Japanese Patent Gazette for Opposition No. 63-51437

Patent Document No. 2: Japanese Patent Application Laid-Open Publication No. 61-93787

Patent Document No. 3: Japanese Patent Application Laid-Open Publication No. 8-9395

Patent Document No. 4: Japanese Patent Gazette for Opposition No. 6-28450

SUMMARY OF INVENTION

Technical Problem

Since complementary color filters are used according to the color representation techniques disclosed in Patent Documents Nos. 1 to 4, the optical efficiency can be certainly increased compared to a method in which primary color filters are used. Nevertheless, even according to the methods of Patent Document Nos. 1 to 4, color filters used are subtractive types, and therefore, the incoming light is partially absorbed, thus inevitably causing some loss of the light, which is a problem.

It is therefore an object of the present invention to provide a color representation technique that can reduce such loss of light significantly when pixel signals are read in the field accumulation mode by interlaced scanning.

Solution to Problem

A solid-state image sensor according to the present invention includes: a photosensitive cell array in which a plurality of unit blocks, each including eight photosensitive cells that are arranged in four rows and two columns, are arranged in a matrix pattern; and a dispersing element array being arranged to face the photosensitive cell array and including a first dispersing element that is arranged to face a photosensitive cell that is located at a row 1, column 2 position, a second dispersing element that is arranged to face a photosensitive cell that is located at a row 2, column 1 position, a third dispersing element that is arranged to face a photosensitive cell that is located at a row 3, column 1 position, and a fourth dispersing element that is arranged to face a photosensitive cell that is located at a row 4, column 1 position. The first dispersing element makes a light ray with a first color component incident on a photosensitive cell at a row 1, column 1 position and makes the rest of incoming light other than the light ray with the first color component incident on the photosensitive cell at the row 1, column 2 position. The second dispersing element makes a light ray with a second color component incident on a photosensitive cell at a row 2, column 2 position and makes the rest of the incoming light other than the light ray with the second color component incident on the photosensitive cell at the row 2, column 1 position. The third dispersing element makes the light ray with the first color component incident on a photosensitive cell at a row 3, column 2 position and makes the rest of the incoming light other than the light ray with the first color component incident on the photosensitive cell at the row 3, column 1 position. And the fourth dispersing element makes the light ray with the second color component incident on a photosensitive cell at a row 4, column 2 position and also makes the rest of the incoming light other than the light ray with the second color component incident on the photosensitive cell at the row 4, column 1 position.

In each said unit block, the first dispersing element may make one and the other halves of the light ray with the first color component incident on the photosensitive cell at the row 1, column 1 position and on a photosensitive cell that is located at a row 1, column 1 position in a first adjacent unit block, respectively. The second dispersing element may make one and the other halves of the light ray with the second color component incident on the photosensitive cell at the row 2, column 2 position and on a photosensitive cell that is located at a row 2, column 2 position in a second adjacent unit block, respectively. The third dispersing element may make one and the other halves of the light ray with the first color component incident on the photosensitive cell at the row 3, column 2 position and on a photosensitive cell that is located at a row 3, column 2 position in the second adjacent unit block, respectively. And the fourth dispersing element may make one and the other halves of the light ray with the second color component incident on the photosensitive cell at the row 4, column 2 position and on a photosensitive cell that is located at a row 4, column 2 position in the second adjacent unit block, respectively.

Each said unit block may be arranged so that each of the photosensitive cells that are located at the row 1, column 1 and row 3, column 2 positions receives not only three light rays having the first, second and third color components, respectively, which have come directly and have been transmitted through no dispersing elements, but also the light ray with the first color component, which has come from a dispersing element that faces its adjacent photosensitive cell. Each of the photosensitive cells that are located at the row 2, column 2 and row 4, column 2 positions receives not only the three light rays having the first, second and third color components, respectively, which have come directly and have been transmitted through no dispersing elements, but also the light ray with the second color component, which has come from a dispersing element that faces its adjacent photosensitive cell. Each of the photosensitive cells that are located at the row 1, column 2 and row 3, column 1 positions receives the rest of the incoming light other than the light ray with the first color component from the dispersing element that faces the photosensitive cell. And each of the photosensitive cells that are located at the row 2, column 1 and row 4, column 1 positions receives the rest of the incoming light other than the light ray with the second color component from the dispersing element that faces the photosensitive cell.

Another solid-state image sensor according to the present invention includes: a photosensitive cell array in which a plurality of unit blocks, each including eight photosensitive cells that are arranged in four rows and two columns, are arranged in a matrix pattern; and a dispersing element array being arranged to face the photosensitive cell array and including a first dispersing element that is arranged to face a photosensitive cell that is located at a row 1, column 2 position, a second dispersing element that is arranged to face a photosensitive cell that is located at a row 2, column 1 position, a third dispersing element that is arranged to face a photosensitive cell that is located at a row 3, column 2 position, and a fourth dispersing element that is arranged to face a photosensitive cell that is located at a row 4, column 2 position. The first dispersing element makes a light ray with a first color component incident on a photosensitive cell at a row 1, column 1 position and makes the rest of incoming light other than the light ray with the first color component incident on the photosensitive cell at the row 1, column 2 position. The second dispersing element makes a light ray with a second color component incident on a photosensitive cell at a row 2, column 2 position and makes the rest of the incoming light other than the light ray with the second color component incident on the photosensitive cell at the row 2, column 1 position. The third dispersing element makes the light ray with the first color component incident on a photosensitive cell at a row 3, column 1 position and makes the rest of the incoming light other than the light ray with the first color component incident on the photosensitive cell at the row 3, column 2 position. And the fourth dispersing element makes the light ray with the second color component incident on a photosensitive cell at a row 4, column 1 position and makes the rest of the incoming light other than the light ray with the second color component incident on the photosensitive cell at the row 4, column 2 position.

In each said unit block, the first dispersing element may make one and the other halves of the light ray with the first color component incident on the photosensitive cell at the row 1, column 1 position and on a photosensitive cell that is located at a row 1, column 1 position in a first adjacent unit block, respectively. The second dispersing element may make one and the other halves of the light ray with the second color component incident on the photosensitive cell at the row 2, column 2 position and on a photosensitive cell that is located at a row 2, column 2 position in a second adjacent unit block, respectively. The third dispersing element may make one and the other halves of the light ray with the first color component incident on the photosensitive cell at the row 3, column 1 position and on a photosensitive cell that is located at a row 3, column 1 position in the first adjacent unit block, respectively. And the fourth dispersing element may make one and the other halves of the light ray with the second color component incident on the photosensitive cell at the row 4, column 1 position and on a photosensitive cell that is located at a row 4, column 1 position in the first adjacent unit block, respectively.

Each said unit block may be arranged so that each of the photosensitive cells that are located at the row 1, column 1 and row 3, column 1 positions receives not only three light rays having the first, second and third color components, respectively, which have come directly and have been transmitted through no dispersing elements, but also the light ray with the first color component, which has come from a dispersing element that faces its adjacent photosensitive cell. Each of the photosensitive cells that are located at the row 2, column 2 and row 4, column 1 positions receives not only the three light rays having the first, second and third color components, respectively, which have come directly and have been transmitted through no dispersing elements, but also the light ray with the second color component, which has come from a dispersing element that faces its adjacent photosensitive cell. Each of the photosensitive cells that are located at the row 1, column 2 and row 3, column 2 positions receives the rest of the incoming light other than the light ray with the first color component from the dispersing element that faces the photosensitive cell. And each of the photosensitive cells that are located at the row 2, column 1 and row 4, column 2 positions receives the rest of the incoming light other than the light ray with the second color component from the dispersing element that faces the photosensitive cell.

In one preferred embodiment, the first color component is one of red and blue components, and the second color component is the other of the red and blue components.

An image capture device according to the present invention includes: a solid-state image sensor according to any of the preferred embodiments of the present invention described above; an optical system that forms an image on an imaging area of the solid-state image sensor; and a signal processing section that processes the output signal of the solid-state image sensor to generate color information.

Advantageous Effects of Invention

A solid-state image sensor according to the present invention generates color information by using a dispersing element that disperses light according to the wavelength range instead of a subtractive color filter. Consequently, not only can the loss of light be cut down compared to the prior art but also can good luminance and color signals be generated in the field accumulation mode.

DESCRIPTION OF EMBODIMENTS

Figure 1:
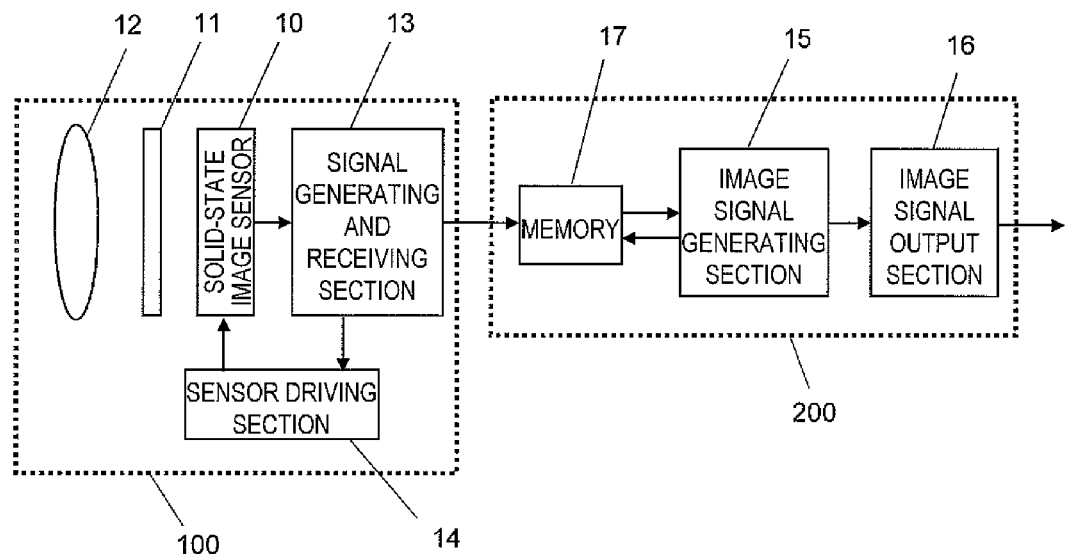
FIG. 1 illustrates an overall configuration for an image capture device as a first preferred embodiment of the present invention.

Hereinafter, preferred embodiments of the present invention will be described with reference to FIGS. 1 through 9. In the following description, any pair of components shown in multiple drawings and having substantially the same function will be identified by the same reference numeral. Also, in the following description, to spatially disperse incident light into multiple components of light falling within mutually different wavelength ranges or representing respectively different color components will be referred to herein as "dispersing of light".

(Embodiment 1)

First of all, an image capture device as a first specific preferred embodiment of the present invention will be described with reference to FIGS. 1 through 6. FIG. 1 is a block diagram illustrating an overall configuration for an image capture device as a first preferred embodiment of the present invention. The image capture device of this preferred embodiment is a digital electronic camera and includes an image capturing section 100 and a signal processing section 200 that receives a signal from the image capturing section 100 and outputs a signal representing an image (i.e., an image signal).

The image capturing section 100 includes an optical lens 12 for imaging a given subject, an optical filter 11, a solid-state image sensor 10 for converting the optical information that has been gotten through the optical lens 12 and the optical filter 11 into an electrical signal by photoelectric conversion. The image capturing section 100 further includes a signal generating and receiving section 13, which not only generates a fundamental signal to drive the image sensor 10 but also receives the output signal of the image sensor 10 and sends it to the signal processing section 200 and a sensor driving section 14 for driving the image sensor 10 in accordance with the fundamental signal generated by the signal generating and receiving section 13. The optical lens 12 is a known lens and may be a lens unit including multiple lenses. The optical filters 11 are a combination of a quartz crystal low-pass filter for reducing a moiré pattern to be caused by a pixel arrangement with an infrared cut filter for filtering out infrared rays. The image sensor 10 is typically a CCD or CMOS sensor, and may be fabricated by known semiconductor device processing technologies. The signal generating and receiving section 13 and the sensor driving section 14 may be implemented as an LSI such as a CCD driver.

The signal processing section 200 includes an image signal generating section 15 for generating an image signal by processing the signal supplied from the image capturing section 100, a memory 17 for storing various kinds of data that have been produced while the image signal is being generated, and an image signal output section 16 for sending out the image signal thus generated to an external device. The image signal generating section 15 is preferably a combination of a hardware component such as a known digital signal processor (DSP) and a software program for use to perform image processing involving the image signal generation. The memory 17 may be a DRAM, for example. And the memory 17 not only stores the signal supplied from the image capturing section 100 but also temporarily retains the image data that has been generated by the image signal generating section 15 or compressed image data. These image data are then output to either a storage medium or a display section (neither is shown) by way of the image signal output section 16.

The image capture device of this preferred embodiment actually further includes an electronic shutter, a viewfinder, a power supply (or battery), a flashlight and other known components. However, the description thereof will be omitted herein because none of them are essential components that would make it difficult to understand how the present invention works unless they were described in detail. It should also be noted that this configuration is just an example. Rather, the present invention may also be carried out as any other appropriate combination of known elements except the image sensor 10.

Hereinafter, the solid-state image sensor 10 of this preferred embodiment will be described.

Figure 2:
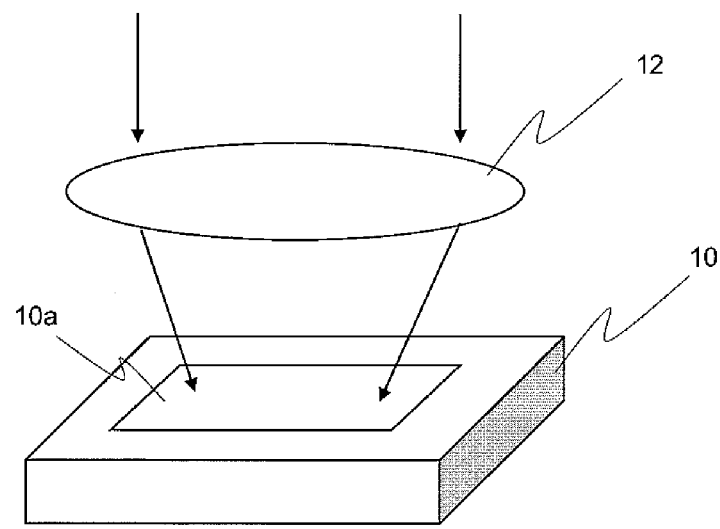
FIG. 2 illustrates how a lens and an image sensor are arranged in the first preferred embodiment of the present invention.

FIG. 2 schematically illustrates how the light that has been transmitted through the lens 12 is incident on the image sensor 10 during an exposure. In FIG. 2, shown are only the lens 12 and the image sensor 10 with illustration of the other components omitted for the sake of simplicity. Also, although the lens 12 actually often consists of a number of lenses that are arranged in the optical axis direction, the lens 12 shown in FIG. 2 is illustrated as a single lens in a simplified form. On the imaging area 10a of the image sensor 10, arranged two-dimensionally are a number of photosensitive cells (pixels) that form a photosensitive cell array. Those photosensitive cells are typically photodiodes, each of which outputs, as a pixel signal, a photoelectrically converted signal representing the intensity of the light received (which will be referred to herein as an "incident light intensity"). The light (visible radiation) that has been transmitted through the lens 12 and the optical filter 11 is incident on the imaging area 10a. Generally speaking, the intensity of the light impinging on the imaging area 10a and the distribution of the quantities of incoming light rays that fall within multiple different wavelength ranges (which will be referred to herein as a "disperse light distribution") vary from one point of incidence to another.

Figure 3:
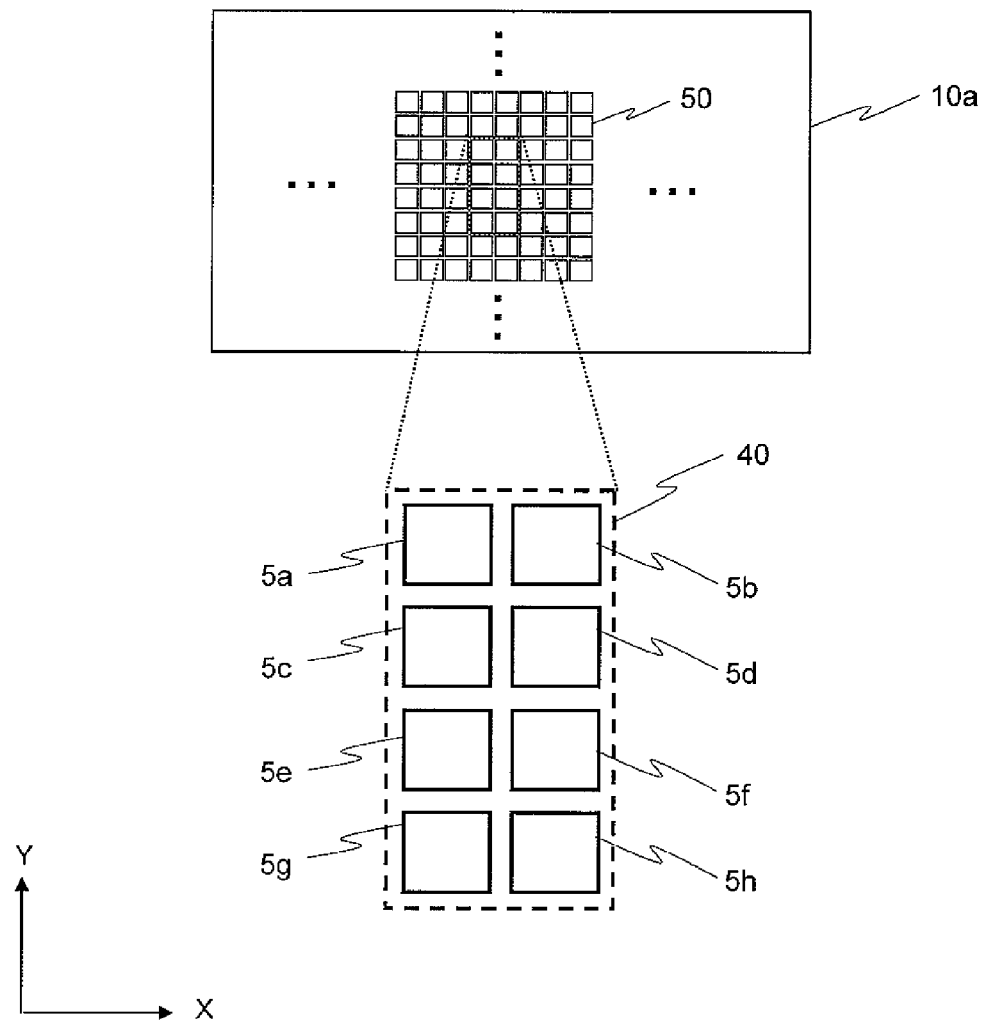
FIG. 3 schematically illustrates the arrangement of pixels in an image sensor according to the first preferred embodiment of the present invention.
Figure 4:
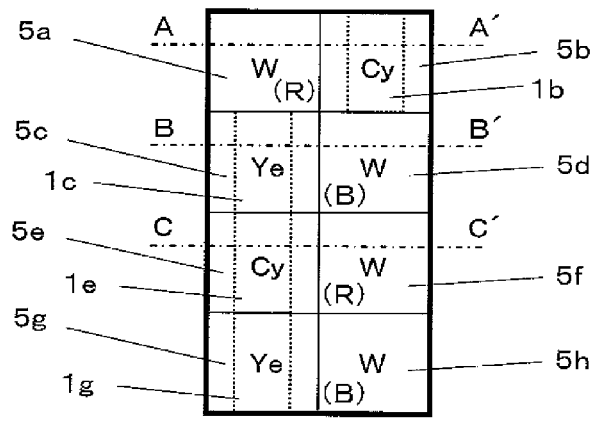
FIG. 4(a) is a plan view illustrating the basic structure of an image sensor according to the first preferred embodiment of the present invention and FIGS. 4(b), 4(c) and 4(d) are cross-sectional views thereof as respectively viewed on the planes AA', BB' and CC' shown in FIG. 4(a).
Figure 4:
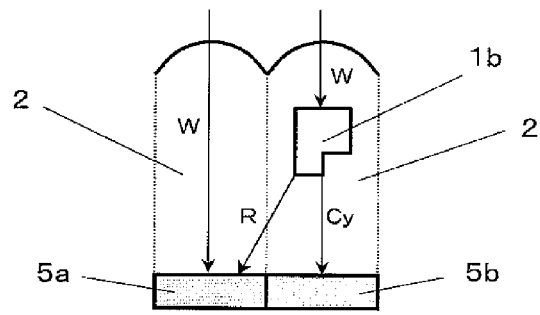
Figure 4:
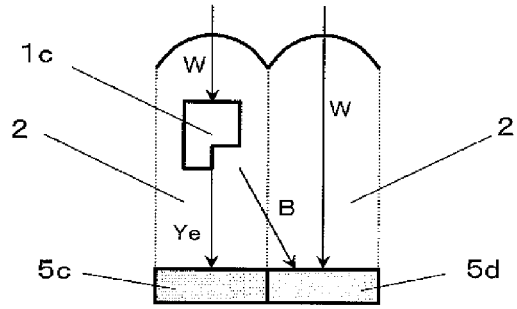
Figure 4:
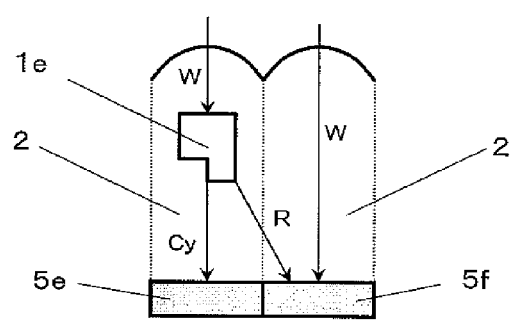

FIG. 3 is a plan view illustrating the arrangement of pixels according to a preferred embodiment of the present invention. The photosensitive cell array 50 may be made up of a number of photosensitive cells that are arranged on the imaging area 10a to form a tetragonal lattice. The photosensitive cell array 50 is comprised of a number of unit blocks 40, each of which consists of eight photosensitive cells 5a, 5b, 5c, 5d, 5e, 5f, 5g and 5h that are arranged in four rows and two columns. Optionally, in an alternative preferred embodiment of the present invention, the photosensitive cells may also have an oblique lattice arrangement, instead of such a tetragonal lattice arrangement, or any other appropriate arrangement. In the following description, the XY coordinate system shown in FIG. 3 will be used to indicate a direction. Also, in this description, the X and Y directions will be sometimes referred to herein as a "horizontal direction" and a "vertical direction", respectively.

A dispersing element array consisting of multiple dispersing elements is arranged on the light incident side so as to face the photosensitive cell array 50. Hereinafter, the dispersing elements of this preferred embodiment will be described.

The dispersing element of this preferred embodiment is an optical element for refracting incoming light to multiple different directions according to the wavelength range by utilizing diffraction of the light to produce on the boundary between two different light-transmitting members with mutually different refractive indices. The dispersing element of that type includes high-refractive-index transparent portions (core portions), which are made of a material with a relatively high refractive index, and low-refractive-index transparent portions (clad portions), which are made of a material with a relatively low refractive index and which contact with side surfaces of the core portions. Since the core portion and the clad portion have mutually different refractive indices, a phase difference is caused between the light rays that have been transmitted through the core and clad portions, thus producing diffraction. And since the magnitude of the phase difference varies according to the wavelength of the light, the incoming light can be spatially dispersed according to the wavelength range into multiple light rays with respective color components. For example, one and the other halves of a light ray with a first color component can be refracted toward first and second directions, respectively, and the rest of incoming light other than the light ray with the first color component can be refracted toward a third direction. Alternatively, three light rays falling within respectively different wavelength ranges (or having mutually different color components) could be refracted toward three different directions, too. Since the incoming light can be dispersed due to the difference in refractive index between the core and clad portions, the high-refractive-index transparent portion will be sometimes referred to herein as a "dispersing element". Such diffractive dispersing elements are disclosed in Japanese Patent Publication No. 4264465, for example.

A dispersing element array, including such dispersing elements, may be fabricated by performing thin-film deposition and patterning processes by known semiconductor device processing technologies. By appropriately determining the material (and refractive index), shape, size and arrangement pattern of the dispersing elements, multiple light rays falling within intended wavelength ranges can be made to be incident on respective photosensitive cells either separately from each other or combined together. As a result, signals representing required color components can be calculated based on a set of photoelectrically converted signals supplied from the respective photosensitive cells. Hereinafter, it will be described with reference to FIG. 4 what basic structure the image sensor 10 of this preferred embodiment has and how the respective dispersing elements work.

FIG. 4(a) is a plan view schematically illustrating the basic structure of the image sensor 10. In each unit block, dispersing elements 1b, 1c, 1e and 1g are arranged so as to face four photosensitive cells (or pixels) 5b, 5c, 5e and 5g, respectively. However, no dispersing elements are provided to face the other pixels 5a, 5d, 5f and 5h. A pattern in which multiple elements, each having such a basic structure, are arranged iteratively is formed on the imaging area 10a.

Each of the dispersing elements 1b and 1e that face pixels 5b and 5e at row 1, column 2 and row 3, column 1 positions, respectively, makes a light ray falling within a wavelength range associated with a cyan (i.e., green and blue) component (i.e., a Cy ray) incident on a pixel that faces itself and also make a light ray falling within a wavelength range associated with red component (i.e., an R ray) incident on another pixel that is horizontally adjacent to the former pixel. Each of the dispersing elements 1c and 1g that face pixels 5c and 5g at row 2, column 1 and row 4, column 1 positions, respectively, makes a light ray falling within a wavelength range associated with a yellow (i.e., red and green) component (i.e., a Ye ray) incident on a pixel that faces itself and also make a light ray falling within a wavelength range associated with blue component (i.e., a B ray) incident on another pixel that is horizontally adjacent to the former pixel. As no dispersing elements are provided to face the other pixels 5a, 5d, 5f and 5h at row 1, column 1, row 2, column 2, row 3, column 2 and row 4, column 2 positions, each of these pixels receives directly incoming visible radiation (i.e., W light) that has not been transmitted through any dispersing element. In FIG. 4(a), shown are signs representing the color components of the light rays that are incident on the respective pixels. It should be noted that each sign in parentheses shown in FIG. 4(a) represents the color component of the light ray that comes from a dispersing element that faces an adjacent pixel.

FIGS. 4(b), 4(c) and 4(d) are schematic cross-sectional views as respectively viewed on the planes AA', BB' and CC' shown in FIG. 4(a). As the structure of the fourth row in FIG. 4(a) is the same as that of the second row, no cross-sectional view is provided for the fourth row.

FIG. 4(b) illustrates the cross-sectional structure of the first row of this pixel arrangement. The photosensitive cells 5a and 5b are covered with a transparent layer 2, which is made of a light-transmissive material that has a lower refractive index than the dispersing elements. The light incident surface of the transparent layer 2 has a convex lens structure. As a result, the incoming light can be converged onto the respective photosensitive cells more perfectly. Each of the other second through fourth rows may have quite the same transparent layer 2 and exactly the same convex lens structure. However, this is just an example of the present invention and the light incident surface of the transparent layer 2 does not have to have such a convex lens structure.

A dispersing element 1b that disperses the incoming light into R and Cy rays is arranged to face the photosensitive cell 5b at the row 1, column 2 position. The photosensitive cell 5a at the row 1, column 1 position receives not only visible radiation W (=R±G±B) but also the R ray that has come from the dispersing element 1b at the row 1, column 2 position as well. The dispersing element 1b at the row 1, column 2 position is made of a transparent high-refractive-index material, and is a plate member that is elongated in the light traveling direction and that is notched at its light outputting end. As having such a shape and a different refractive index from its surrounding transparent layer 2, the dispersing element 1b makes the R ray incident on the photosensitive cell 5a at the row 1, column 1 position and also makes a Cy ray incident on the photosensitive cell 5b that faces itself at the row 1, column 2 position.

FIG. 4(c) illustrates the cross-sectional structure of the second row of this pixel arrangement. The dispersing element 1c at the row 2, column 1 position is also made of a transparent high-refractive-index material, and is too a plate member that is elongated in the light traveling direction and that is notched at its light outputting end. As having such a shape and a different refractive index from its surrounding transparent layer 2, the dispersing element 1c makes a Ye ray incident on the photosensitive cell 5c at the row 2, column 1 position and also makes a B ray incident on the photosensitive cell 5d at the row 2, column 2 position. The photosensitive cell 5d at the row 2, column 2 position receives not only visible radiation W that has come directly but also the B ray that has come from the dispersing element 1c at the row 2, column 1 position as well. The fourth row of this pixel arrangement has quite the same cross-sectional structure as this second row and light rays are incident on respective pixels in totally the same way.

FIG. 4(d) illustrates the cross-sectional structure of the third row of this pixel arrangement. The dispersing element 1e at the row 3, column 1 position has the same shape as, but faces the opposite direction from, the dispersing element 1b at the row 1, column 2 position. That is why the photosensitive cell 5e at the row 3, column 1 position receives a Cy ray, while the photosensitive cell 5f at the row 3, column 2 position receives directly incoming W light and the R ray that has come from the dispersing element 1e.

Figure 5:
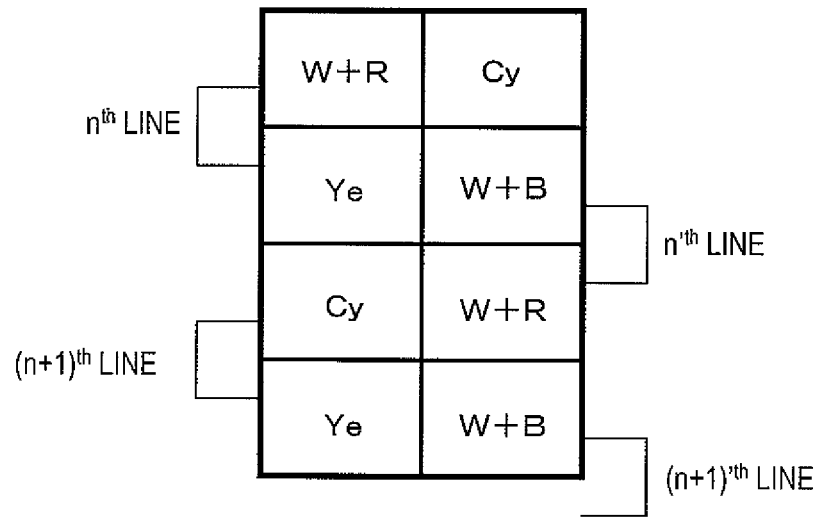
FIG. 5 shows the color components of light rays incident on respective pixels in the first preferred embodiment of the present invention.

FIG. 5 shows the color components of the light rays received at the respective photosensitive cells. With the arrangement described above adopted, each of the pixels at the row 1, column 1 position and the row 3, column 2 position receives W light and an R ray, each of the pixels at the row 1, column 2 position and the row 3, column 1 position receives a Cy ray (i.e., G and B rays), and each of the pixels at the row 2, column 1 position and the row 4, column 1 position receives a Ye ray (i.e., R and G rays).

In the field accumulation mode, the luminance and color difference signals are represented as follows. As for the first field, the first and second rows shown in FIG. 5 correspond to the $n^{th}$ line and the third and fourth rows correspond to the $(n+1)^{th}$ line. Since the pixel signals of two vertically adjacent pixels are added together, the $n^{th}$ line signals for the first field become iterative pairs of signals $S_{n,1}$ and $S_{n,2}$ represented by the following Equations (8) and (9):

$$S_{n,1}=Ws+Rs+Ys=3Rs+2Gs+Bs \tag{8}$$

$$S_{n,2}=Cs+Ws+Bs=Rs+2Gs+3Bs \tag{9}$$

Meanwhile, the $(n+1)^{th}$ line signals for the first field become iterative pairs of signals $S_{n+1,1}$ and $S_{n+1,2}$ represented by the following Equations (10) and (11):

$$S_{n+1,1}=Cs+Ys=Rs+2Gs+Bs \tag{10}$$

$$S_{n+1,2}=2Ws+Rs+Bs=3Rs+2Gs+3Bs \tag{11}$$

The luminance signal YL is generated by adding together the signals of two adjacent columns with respect to each line. That is why for both of the $n^{th}$ and $(n+1)^{th}$ lines, the luminance signal YL is calculated by the following Equation (12):

$$YL = S_{n,1} + S_{n,2} = S_{n+1,1} + S_{n+1,1} = 4Rs + 4Gs + 4Bs \quad (12)$$

On the other hand, the color difference signal is generated in the following manner. First of all, subtraction is performed on the signals of two adjacent columns with respect to each line. As a result, a signal $C(n)$ represented by the following Equation (13) is obtained for the $n^{th}$ line and a signal $C(n+1)$ represented by the following Equation (14) is obtained for the $(n+1)^{th}$ line:

$$C(n) = S_{n,1} - S_{n,2} = 2Rs - 2Bs \quad (13)$$

$$C(n+1) = S_{n+1,2} - S_{n+1,1} = 2Rs + 2Bs \quad (14)$$

Next, 4Rs is obtained by calculating $C(n)+C(n+1)$ and 4Bs is obtained by calculating $C(n+1)-C(n)$. And by calculating differences between 4Rs and 4Bs thus obtained and the luminance signal YL, color difference signals (R−Y) and (B−Y) represented by the following Equations (15) and (16) (where α and β are coefficients for correcting a white balance) are generated. The α and β values are set so that when a white subject is shot, the color difference signals (R−Y) and (B−Y) become equal to zero:

$$R-Y = 4Rs - \alpha YL \quad (15)$$

$$B-Y = 4Bs - \beta YL \quad (16)$$

As for the second field, the second and third rows of the pixel arrangement define the $n^{th}$ line, the fourth and fifth rows define the $(n+1)^{th}$ line, and the pixel signals of two vertically adjacent pixels are added together. As a result, the $n^{th}$ line signals become iterative pairs of signals (Ys+Cs) and (2Ws+Rs+Bs) and the $(n+1)^{th}$ line signals become iterative pairs of signals (Ys+Ws+Rs) and (Ws+Bs+Cs). That is to say, the read signals for the second field have shifted by one line from the read signals for the first field. However, the signals that have been read are the same overall. Consequently, both the luminance signals and the color difference signals can be generated by performing quite the same signal processing as in the first field.

As described above, when making interlaced scanning in the field accumulation mode, the image capture device of this preferred embodiment can generate luminance signals and color difference signals representing the same piece of color information by performing the same signal processing for the first and second fields.

In the image capture device of this preferred embodiment, the image signal generating section 15 generates color information by performing the signal arithmetic operations described above. The color information thus generated is output by the image signal output section 16 to a storage medium or display device (neither is shown).

As described above, in the image capture device of this preferred embodiment, a dispersing element array is arranged so as to face a photosensitive cell array that uses a matrix consisting of pixels that are arranged in four rows and two columns as a unit block. No dispersing elements are provided to face pixels at row 1, column 1, row 2, column 2, row 3, column 2 and row 4, column 2 positions, each of which receives directly incoming light that has been transmitted through the transparent layer 2. A dispersing element is arranged to face each of the pixels at the row 1, column 2 and row 3, column 1 positions so that an R ray included in the incoming light is incident on another pixel that is adjacent to the pixel that faces it and that a Cy ray (i.e., G and B rays) is incident on the latter pixel. On the other hand, a dispersing element is arranged to face each of the pixels at the row 2, column 1 and row 4, column 1 positions so that a B ray included in the incoming light is incident on another pixel that is adjacent to the pixel that faces it and that a Ye ray (i.e., R and G rays) is incident on the latter pixel. By using these dispersing elements, color representation can be carried out when making interlaced scanning in the field accumulation mode and the loss of light can be reduced significantly. These are effects to be achieved by this preferred embodiment.

Ideally, each dispersing element should make almost all of the R or B ray included in the incoming light incident on a pixel that is adjacent to the pixel that faces itself and make almost all of the rest of the light incident on that pixel that faces itself. However, there is no problem even if some loss of light is incurred. Good color information can be obtained by correcting the signals according to the degree of the loss of light.

Optionally, the signal arithmetic processing performed by the image signal generating section 15 of this preferred embodiment may be performed by another device, not the image capture device itself. For example, the color information can also be generated by getting a program defining the signal arithmetic processing of this preferred embodiment executed by an external device that has been provided with the photoelectrically converted signals by the image sensor 10.

Figure 6:
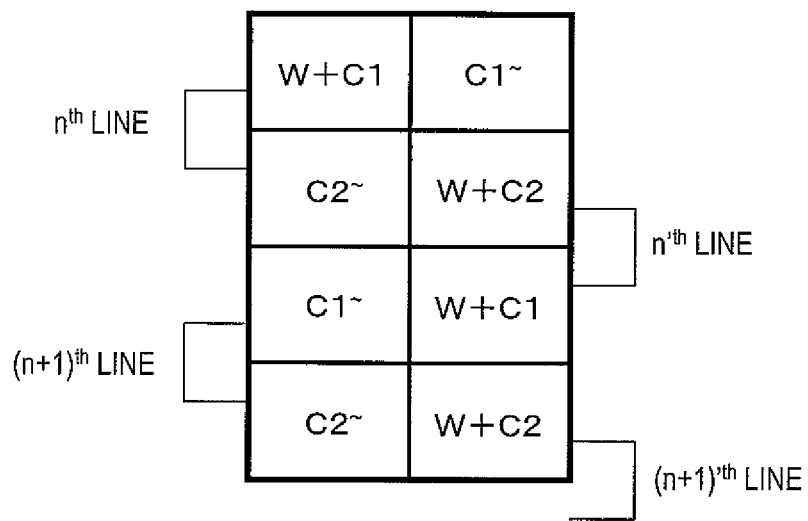
FIG. 6 shows generalized versions of the color components of the light rays incident on the respective pixels in the first preferred embodiment of the present invention.

In the preferred embodiment described above, a dispersing element that disperses the incoming light into R and Cy rays and a dispersing element that disperses the incoming light into B and Ye rays are supposed to be used. However, any other dispersing element may also be used. Speaking more generally, supposing the incoming light W is a set of light rays C1, C2 and C3 with three color components, a dispersing element that disperses the incoming light into a C1 ray and its complementary color ray C1 (=W−C1=C2+C3) and a dispersing element that disperses the incoming light into a C2 ray and its complementary color ray C2 (=W−C2=C1+C3) may be used. FIG. 6 shows the color components of the light rays received at the respective pixels in such a generalized situation.

In such a generalized situation, the luminance signal YL and the color difference signals (R−Y) and (B−Y) may be generated in the following procedure.

First of all, for both of the first and second fields, signals for the $n^{th}$ line become iterative pairs of the signals $S_{n,1}$ and $S_{n,2}$ represented by the following Equations (17) and (18). In this case, signals representing the C1, C1, C2, C2, and C3 rays are identified by C1s, C1s, C2s, C2s, and C3s, respectively:

$$S_{n,1} = Ws + C1s + C2s = 3C1s + C2s + 2C3s \quad (17)$$

$$S_{n,2} = C1s + Ws + C2s = C1s + 3C2s + 2C3s \quad (18)$$

Also, for both of the first and second fields, signals for the $(n+1)^{th}$ line become iterative pairs of the signals $S_{n+1,1}$ and $S_{n+1,2}$ represented by the following Equations (19) and (20).

$$S_{n+1,1} = C1s + C2s = C1s + C2s + 2C3s \quad (19)$$

$$S_{n+1,2} = 2Ws + C1s + C2s = 3C1s + 3C2s + 2C \quad (20)$$

Consequently, for both of the $n^{th}$ and $(n+1)^{th}$ lines, the luminance signal YL is represented by the following Equation (21):

$$YL = S_{n,1} + S_{n,2} = S_{n+1,1} + S_{n+1,1} = 4C1s + 4C2s + 4C3s = 4Ws \quad (21)$$

Meanwhile, to calculate the color difference signal, subtraction is performed on the signals of two columns with respect to each line. As a result, a signal C(n) represented by the following Equation (22) is obtained for the $n^{th}$ line and a signal C(n+1) represented by the following Equation (23) is obtained for the $(n+1)^{th}$ line:

$$C(n)=S_{n,1}-S_{n,2}=2C1s-2C2s \quad (22)$$

$$C(n+1)=S_{n+1,2}-S_{n+1,1}=2C1s+2C2s \quad (23)$$

Next, 4C1s is obtained by calculating C(n)+C(n+1) and 4C2s is obtained by calculating C(n+1)−C(n). And by calculating differences between 4C1s and 4C2s thus obtained and the luminance signal YL, color difference signals (R−Y) and (B−Y) represented by the following Equations (24) and (25) (where α and β are coefficients for correcting a white balance) are generated. The α and β values are set so that when a white subject is shot, the color difference signals (R−Y) and (B−Y) become equal to zero:

$$R-Y=4C1s-\alpha YL \quad (24)$$

$$B-Y=4C1s-\beta YL \quad (25)$$

In this manner, even if the color components are generalized, color information can also be generated by performing the signal arithmetic operations described above.

In the preferred embodiment described above, an element that disperses incoming light into multiple light rays through a diffraction to be produced due to a difference in refractive index between two members is used as the dispersing element. However, a dispersing element according to the present invention does not have to be such a diffractive one. Alternatively, a similar effect can also be achieved even by using a micro prism or a dichroic mirror as the dispersing element.

(Embodiment 2)

Next, a second specific preferred embodiment of the present invention will be described with reference to FIGS. 7 and 8. The only difference between the image capture device of this preferred embodiment and its counterpart of the first preferred embodiment described above lies in the arrangement of dispersing elements with respect to third and fourth rows of pixels in the pixel arrangement of the image sensor. Thus, the following description of this second preferred embodiment will be focused on only that difference from the first preferred embodiment and their common features will not be described all over again to avoid redundancies.

Figure 7:
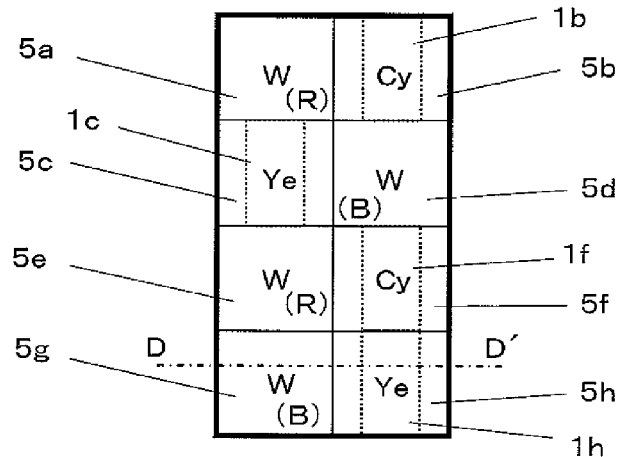
FIG. 7(a) is a plan view illustrating the basic structure of an image sensor according to a second preferred embodiment of the present invention and FIG. 7(b) is a cross-sectional view thereof as viewed on the plane DD' shown in FIG. 7(a).
Figure 7:
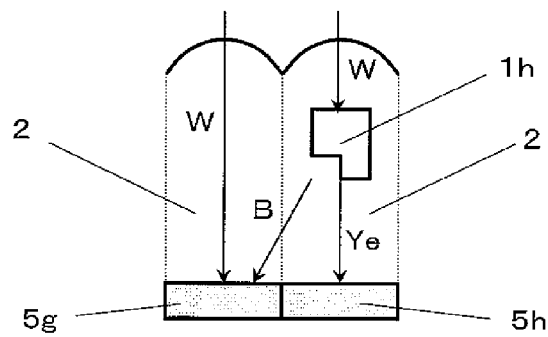

FIG. 7(a) is a plan view schematically illustrating the basic structure of the image sensor 10 of this preferred embodiment. In each unit block, dispersing elements 1b, 1c, 1f and 1h are arranged so as to face four photosensitive cells 5b, 5c, 5f and 5h, respectively. However, no dispersing elements are provided to face the other photosensitive cells 5a, 5d, 5e and 5g. A pattern in which multiple elements, each having such a basic structure, are arranged iteratively is formed on the imaging area 10a. Thus, although the structure of the first and second rows of this preferred embodiment is the same as in the first preferred embodiment, the dispersing elements for the third and fourth rows are arranged differently in this preferred embodiment than in the first preferred embodiment. Specifically, according to this preferred embodiment, the third row has the same structure as the first row. On the other hand, the fourth row has a similar structure to the second row, but the dispersing elements for the second and fourth rows face two horizontally opposite directions. That is why the cross-sectional structures of the first to third rows are not illustrated in FIG. 7.

FIG. 7(b) illustrates the cross-sectional structure of the fourth row of this pixel arrangement as viewed on the plane DD' shown in FIG. 7(a). As shown in FIG. 7(b), a dispersing element 1h, which makes a B ray included in the incoming light (i.e., W light) incident on the photosensitive cell 5g at the row 4, column 1 position and which also makes a Ye ray (i.e., R and G rays) incident on the photosensitive cell 5h at the row 4, column 2 position, is arranged to face the pixel 5h. Thus, the photosensitive cell 5h at the row 4, column 2 position receives the Ye ray and the photosensitive cell 5g at the row 4, column 1 position receives the W light and the B ray.

Figure 8:
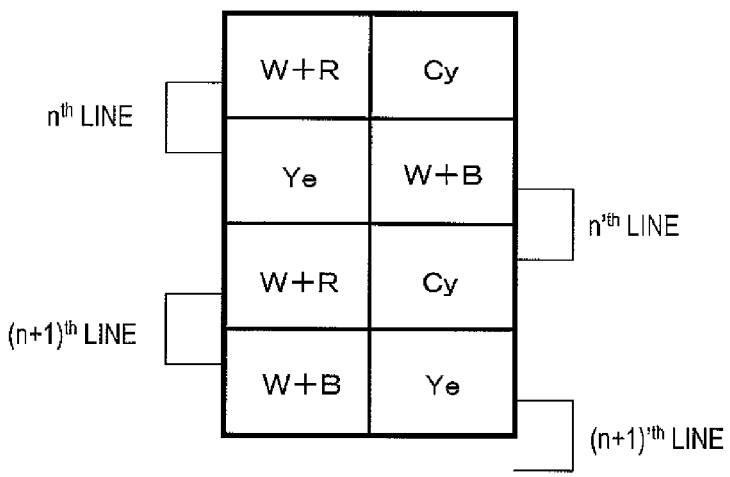
FIG. 8 shows the color components of light rays incident on respective pixels in the second preferred embodiment of the present invention.

FIG. 8 shows the color components of the light rays received at the respective photosensitive cells in this preferred embodiment. With the arrangement described above adopted, each of the pixels at the row 1, column 1 position and the row 3, column 1 position receives W light and an R ray, each of the pixels at the row 2, column 2 position and the row 4, column 1 position receives W light and a B ray, each of the pixels at the row 1, column 2 position and the row 3, column 2 position receives a Cy ray (i.e., G and B rays), and each of the pixels at the row 2, column 1 position and the row 4, column 2 position receives a Ye ray (i.e., R and G rays).

The color components of the light rays received at respective pixels in this preferred embodiment are the same as in the first preferred embodiment described above except that the color components of the light rays received at the row 3, column 1 and row 3, column 2 positions in this preferred embodiment are opposite from in the first preferred embodiment, so are the color components of the light rays received at the row 4, column 1 and row 4, column 2 positions. That is why as in the first preferred embodiment described above, the luminance signal YL of this preferred embodiment is also represented by Equation (12). As for both of the first and second fields, the difference C(n) between two adjacent columns of signals for the $n^{th}$ line is calculated by Equation (13) and the difference C(n+1) between two adjacent columns of signals for the $(n+1)^{th}$ line becomes a signal obtained by inverting the signs in Equation (14). Thus, by performing similar signal arithmetic processing to that of the first preferred embodiment described above, color information can be generated.

Consequently, the image capture device of this preferred embodiment can also carry out color representation when making interlaced scanning in the field accumulation mode and can also reduce the loss of light significantly. These are effects to be achieved by this preferred embodiment.

In this preferred embodiment, a dispersing element that disperses the incoming light into R and Cy rays and a dispersing element that disperses the incoming light into B and Ye rays do not always have to be used, either, but any other dispersing element may be used as well. Speaking more generally, a dispersing element that disperses the incoming light W into a C1 ray and its complementary color ray C1 (=W−C1=C2+C3) and a dispersing element that disperses the incoming light W into a C2 ray and its complementary color ray C2 (=W−C2=C1+C3) may be used.

In the preferred embodiment described above, an element that disperses incoming light into multiple light rays through a diffraction to be produced due to a difference in refractive index between two members is used as the dispersing element. However, a similar effect can also be achieved even by using a micro prism or a dichroic mirror as the dispersing element.

(Embodiment 3)

Figure 9:
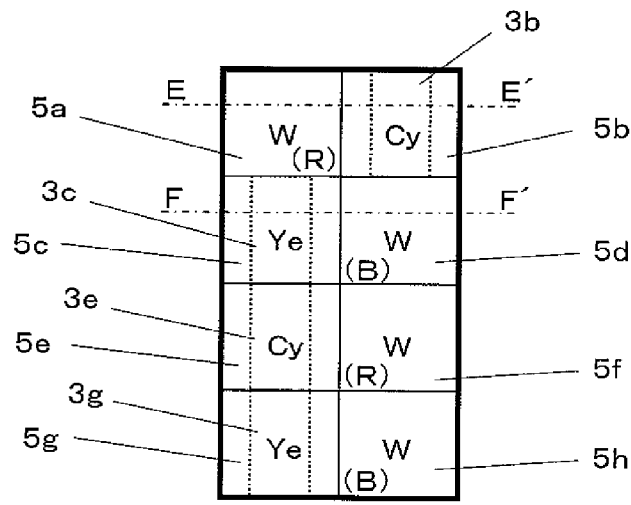
FIG. 9(a) is a plan view illustrating the basic structure of an image sensor according to a third preferred embodiment of the present invention and FIGS. 9(b) and 9(c) are cross-sectional views thereof as respectively viewed on the planes EE' and FF' shown in FIG. 9(a).
Figure 9:
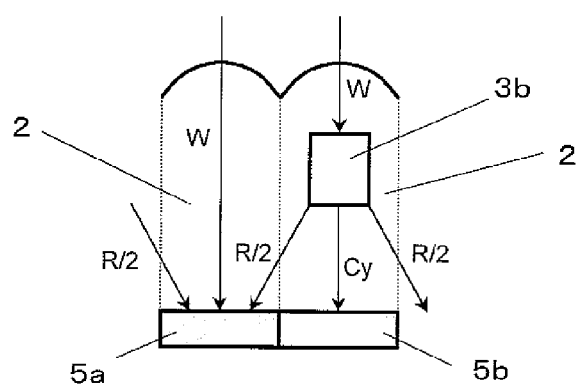
Figure 9:
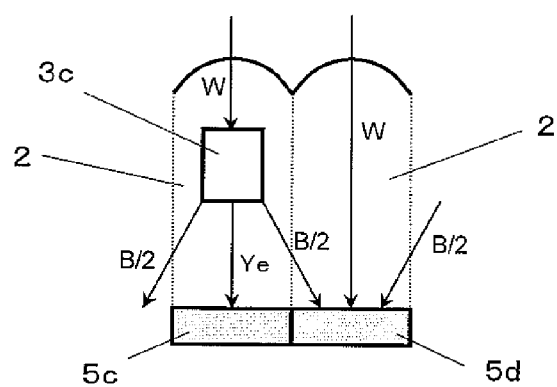
Figure 10:
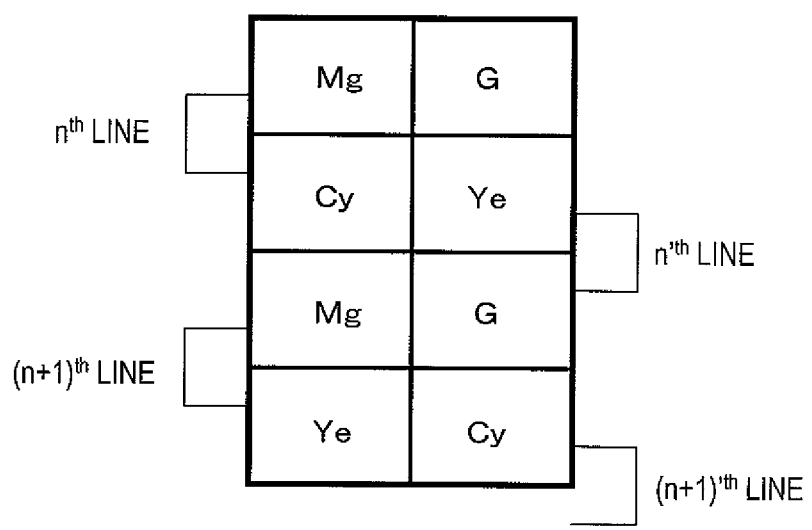
FIG. 10 shows a basic color scheme for use to carry out color representation in a field accumulation mode in Patent Document No. 4.

Next, a third specific preferred embodiment of the present invention will be described with reference to FIG. 9. In the image capture device of this preferred embodiment, the color components of the light rays received at the respective pixels are the same as, but the dispersing elements have different structures and disperse the incoming light differently from, in the image capture device of the first preferred embodiment.

Thus, the following description of this third preferred embodiment will be focused on those differences from the first preferred embodiment and their common features will not be described all over again to avoid redundancies.

FIG. 9(a) is a plan view schematically illustrating the basic structure of the image sensor of this preferred embodiment. In each unit block, dispersing elements 3b, 3c, 3e and 3g are arranged so as to face four photosensitive cells 5b, 5c, 5e and 5g, respectively. However, no dispersing elements are provided to face the other photosensitive cells 5a, 5d, 5f and 5h. A pattern in which multiple elements, each having such a basic structure, are arranged iteratively is formed on the imaging area 10a. In this preferred embodiment, the color components of the light rays received at the respective photosensitive cells are the same as in the first preferred embodiment described above. However, unlike its counterpart of the first preferred embodiment, each dispersing element of this preferred embodiment is designed so as to make one and the other halves of a light ray with a particular color component incident respectively on two horizontally adjacent pixels in equal quantities.

FIG. 9(b) illustrates a cross-sectional structure of the first row of the pixel arrangement as viewed on the plane EE' shown in FIG. 9(a). The dispersing element 3b that is arranged to face the pixel 5b is made of a transparent high-refractive-index material and has a shape that is elongated in the light traveling direction. By using a diffraction to be produced due to a difference in refractive index from the surrounding transparent layer 2, the dispersing element 3b makes a Cy ray incident on the pixel 5b that faces itself, and also makes one and the other halves of an R ray incident on two pixels that are adjacent to the former pixel on the right- and left-hand sides, respectively. As a result, the pixel 5a at the row 1, column 1 position receives visible radiation W that has come directly by way of no dispersing elements at all, a half of an R ray (R/2) that has come from the dispersing element 3b, and a half of an R ray (R/2) that has come from a dispersing element included in an adjacent unit block. In this case, the sign "R/2" indicates that the quantity of the R ray received is a half of the R ray included in the W light that has been incident on the dispersing element 3b. The pixel 5b at the row 1, column 2 position receives a Cy ray (i.e., G and B rays) that has come from the dispersing element 3b that faces itself. Although the arrangement of the dispersing element is shifted by one column, the third row of the pixel arrangement also has the same structure as the first row and the color components of the light rays incident on respective pixels are also the same as in the first row.

FIG. 9(c) illustrates a cross-sectional structure of the second row of the pixel arrangement as viewed on the plane FF' shown in FIG. 9(a). The dispersing element 3c that is arranged to face the pixel 5c is also made of a transparent high-refractive-index material and has a shape that is elongated in the light traveling direction. By using a diffraction to be produced due to a difference in refractive index from the surrounding transparent layer 2, the dispersing element 3c makes a Ye ray incident on the pixel 5c that faces itself, and also makes one and the other halves of a B ray incident on two pixels that are adjacent to the former pixel on the right- and left-hand sides, respectively. As a result, the pixel 5c at the row 2, column 1 position receives a Ye ray (i.e., R and G rays) that have come from the dispersing element 3c that faces it. The pixel 5d at the row 2, column 2 position receives visible radiation W that has come directly by way of no dispersing elements at all, a half of a B ray (B/2) that has come from the dispersing element 3c, and a half of a B ray (B/2) that has come from a dispersing element included in an adjacent unit block. The fourth row of the pixel arrangement also has the same structure as the second row and the color components of the light rays incident on respective pixels are also the same as in the second row.

In this preferred embodiment, the color components of the light rays received at the respective pixels are quite the same as in the first preferred embodiment described above. That is why by performing the signal arithmetic processing of the first preferred embodiment, color representation can be carried out in making interlaced scanning in the field accumulation mode. In addition, since dispersing elements are used instead of primary color filters, the loss of light can be reduced, which is also beneficial. On top of that, since each dispersing element of this preferred embodiment makes two halves of a light ray with a particular color component incident separately on two pixels that are adjacent to the pixel that faces itself, the optical low-pass filter works more effectively horizontally than in the first preferred embodiment described above.

In the preferred embodiment described above, a dispersing element that disperses the incoming light into R and Cy rays and a dispersing element that disperses the incoming light into B and Ye rays are supposed to be used. However, any other dispersing element may also be used. Speaking more generally, a dispersing element that disperses the incoming W light into a C1 ray and its complementary color ray C1 (=W−C1=C2+C3) and a dispersing element that disperses the incoming W light into a C2 ray and its complementary color ray C2 (=W−C2=C1+C3) may be used. In that case, each dispersing element needs to be arranged so as to make one and the other halves of a C1 or C2 ray incident on two adjacent pixels that are located on the right- and left-hand sides of that dispersing element.

In the preferred embodiment described above, an element that disperses incoming light into multiple light rays through a diffraction to be produced due to a difference in refractive index between two members is used as the dispersing element. However, a micro prism, a dichroic mirror or any other dispersing element may also be used.

In this preferred embodiment, each dispersing element makes two halves of a light ray with a single color component incident in equal quantities on two pixels that are adjacent to the pixel that faces the dispersing element itself. However, the dispersing element may also make two light rays incident in different quantities on those pixels that are adjacent to the pixel that faces it. For example, each dispersing element may also be designed so as to make 70% of a light ray with a particular color component, which is included in the incoming light, incident on one of the two pixels that are adjacent to the pixel that faces it and also make the remaining 30% of the light ray with the particular color component incident on the other adjacent pixel. Even so, each pixel, for which no dispersing elements are provided, also receives a light ray with the first color component in the same quantity, and therefore, the same effect as what has already been described can be achieved as well.

Optionally, the dispersing elements of this preferred embodiment and the dispersing elements of the first preferred embodiment described above may also be used in combination. For example, the dispersing elements of this preferred embodiment may be provided for the first and third rows and the dispersing elements of the first preferred embodiment may be provided for the second and fourth rows.

In this preferred embodiment, the dispersing elements are arranged in the same pattern as in the first preferred embodiment. However, the dispersing elements may also be arranged as in the second preferred embodiment. That is to say, in FIG.

9, the dispersing elements provided for the third and fourth rows may be shifted by one column. Even so, the effect of this preferred embodiment will also be achieved in the same way.

INDUSTRIAL APPLICABILITY

The solid-state image sensor and image capture device of the present invention can be used effectively in every camera that ever makes interlaced scanning in the field accumulation mode, and may be used in digital still cameras, digital camcorders and other consumer electronic cameras, solid-state cameras for broadcasting purposes, and industrial surveillance cameras, to name just a few.

REFERENCE SIGNS LIST 1b, 1e, 1f dispersing element that disperses light into R and Cy rays (high-refractive-index material)
1c, 1g, 1h dispersing element that disperses light into B and Ye rays (high-refractive-index material)
2 light-transmissive material
3b, 3e dispersing element that disperses light into R and Cy rays (high-refractive-index material)
3c, 3g dispersing element that disperses light into B and Ye rays (high-refractive-index material)
5a, 5b, 5c, 5d, 5e, 5f, 5g, 5h photosensitive cell (pixel)
10 solid-state image sensor
10a imaging area of solid-state image sensor
11 optical filter
12 optical lens
13 signal generating and receiving section
14 sensor driving section
15 image signal generating section
16 image signal output section
17 memory
40 unit block of photosensitive cell array
50 photosensitive cell array
100 image capturing section
200 signal processing section

The invention claimed is:

1. A solid-state image sensor comprising:
a photosensitive cell array in which a plurality of unit blocks, each including eight photosensitive cells that are arranged in four rows and two columns, are arranged in a matrix pattern; and
a dispersing element array being arranged to face the photosensitive cell array and including a first dispersing element that is arranged to face a photosensitive cell that is located at a row 1, column 2 position, a second dispersing element that is arranged to face a photosensitive cell that is located at a row 2, column 1 position, a third dispersing element that is arranged to face a photosensitive cell that is located at a row 3, column 1 position, and a fourth dispersing element that is arranged to face a photosensitive cell that is located at a row 4, column 1 position,
wherein the first dispersing element makes a light ray with a first color component incident on a photosensitive cell at a row 1, column 1 position and makes the rest of incoming light other than the light ray with the first color component incident on the photosensitive cell at the row 1, column 2 position, and
wherein the second dispersing element makes a light ray with a second color component incident on a photosensitive cell at a row 2, column 2 position and makes the rest of the incoming light other than the light ray with the second color component incident on the photosensitive cell at the row 2, column 1 position, and
wherein the third dispersing element makes the light ray with the first color component incident on a photosensitive cell at a row 3, column 2 position and makes the rest of the incoming light other than the light ray with the first color component incident on the photosensitive cell at the row 3, column 1 position, and
wherein the fourth dispersing element makes the light ray with the second color component incident on a photosensitive cell at a row 4, column 2 position and also makes the rest of the incoming light other than the light ray with the second color component incident on the photosensitive cell at the row 4, column 1 position.

2. The solid-state image sensor of claim 1, wherein in each said unit block,
the first dispersing element makes one and the other halves of the light ray with the first color component incident on the photosensitive cell at the row 1, column 1 position and on a photosensitive cell that is located at a row 1, column 1 position in a first adjacent unit block, respectively,
the second dispersing element makes one and the other halves of the light ray with the second color component incident on the photosensitive cell at the row 2, column 2 position and on a photosensitive cell that is located at a row 2, column 2 position in a second adjacent unit block, respectively,
the third dispersing element makes one and the other halves of the light ray with the first color component incident on the photosensitive cell at the row 3, column 2 position and on a photosensitive cell that is located at a row 3, column 2 position in the second adjacent unit block, respectively, and
the fourth dispersing element makes one and the other halves of the light ray with the second color component incident on the photosensitive cell at the row 4, column 2 position and on a photosensitive cell that is located at a row 4, column 2 position in the second adjacent unit block, respectively.

3. The solid-state image sensor of claim 1, wherein in each said unit block,
each of the photosensitive cells that are located at the row 1, column 1 and row 3, column 2 positions receives not only three light rays having the first, second and third color components, respectively, which have come directly and have been transmitted through no dispersing elements, but also the light ray with the first color component, which has come from a dispersing element that faces its adjacent photosensitive cell,
each of the photosensitive cells that are located at the row 2, column 2 and row 4, column 2 positions receives not only the three light rays having the first, second and third color components, respectively, which have come directly and have been transmitted through no dispersing elements, but also the light ray with the second color component, which has come from a dispersing element that faces its adjacent photosensitive cell,
each of the photosensitive cells that are located at the row 1, column 2 and row 3, column 1 positions receives the rest of the incoming light other than the light ray with the first color component from the dispersing element that faces the photosensitive cell, and
each of the photosensitive cells that are located at the row 2, column 1 and row 4, column 1 positions receives the rest of the incoming light other than the light ray with the second color component from the dispersing element that faces the photosensitive cell.

4. A solid-state image sensor comprising:
a photosensitive cell array in which a plurality of unit blocks, each including eight photosensitive cells that are arranged in four rows and two columns, are arranged in a matrix pattern; and
a dispersing element array being arranged to face the photosensitive cell array and including a first dispersing element that is arranged to face a photosensitive cell that is located at a row 1, column 2 position, a second dispersing element that is arranged to face a photosensitive cell that is located at a row 2, column 1 position, a third dispersing element that is arranged to face a photosensitive cell that is located at a row 3, column 2 position, and a fourth dispersing element that is arranged to face a photosensitive cell that is located at a row 4, column 2 position,
wherein the first dispersing element makes a light ray with a first color component incident on a photosensitive cell at a row 1, column 1 position and makes the rest of incoming light other than the light ray with the first color component incident on the photosensitive cell at the row 1, column 2 position, and
wherein the second dispersing element makes a light ray with a second color component incident on a photosensitive cell at a row 2, column 2 position and makes the rest of the incoming light other than the light ray with the second color component incident on the photosensitive cell at the row 2, column 1 position, and
wherein the third dispersing element makes the light ray with the first color component incident on a photosensitive cell at a row 3, column 1 position and makes the rest of the incoming light other than the light ray with the first color component incident on the photosensitive cell at the row 3, column 2 position, and
wherein the fourth dispersing element makes the light ray with the second color component incident on a photosensitive cell at a row 4, column 1 position and makes the rest of the incoming light other than the light ray with the second color component incident on the photosensitive cell at the row 4, column 2 position.

5. The solid-state image sensor of claim 4, wherein in each said unit block,
the first dispersing element makes one and the other halves of the light ray with the first color component incident on the photosensitive cell at the row 1, column 1 position and on a photosensitive cell that is located at a row 1, column 1 position in a first adjacent unit block, respectively,
the second dispersing element makes one and the other halves of the light ray with the second color component incident on the photosensitive cell at the row 2, column 2 position and on a photosensitive cell that is located at a row 2, column 2 position in a second adjacent unit block, respectively,
the third dispersing element makes one and the other halves of the light ray with the first color component incident on the photosensitive cell at the row 3, column 1 position and on a photosensitive cell that is located at a row 3, column 1 position in the first adjacent unit block, respectively, and
the fourth dispersing element makes one and the other halves of the light ray with the second color component incident on the photosensitive cell at the row 4, column 1 position and on a photosensitive cell that is located at a row 4, column 1 position in the first adjacent unit block, respectively.

6. The solid-state image sensor of claim 4, wherein in each said unit block,
each of the photosensitive cells that are located at the row 1, column 1 and row 3, column 1 positions receives not only three light rays having the first, second and third color components, respectively, which have come directly and have been transmitted through no dispersing elements, but also the light ray with the first color component, which has come from a dispersing element that faces its adjacent photosensitive cell,
each of the photosensitive cells that are located at the row 2, column 2 and row 4, column 1 positions receives not only the three light rays having the first, second and third color components, respectively, which have come directly and have been transmitted through no dispersing elements, but also the light ray with the second color component, which has come from a dispersing element that faces its adjacent photosensitive cell,
each of the photosensitive cells that are located at the row 1, column 2 and row 3, column 2 positions receives the rest of the incoming light other than the light ray with the first color component from the dispersing element that faces the photosensitive cell, and
each of the photosensitive cells that are located at the row 2, column 1 and row 4, column 2 positions receives the rest of the incoming light other than the light ray with the second color component from the dispersing element that faces the photosensitive cell.

7. The solid-state image sensor of one of claim 1, wherein the first color component is one of red and blue components, and
wherein the second color component is the other of the red and blue components.

8. An image capture device comprising:
the solid-state image sensor of one of claim 1;
an optical system that forms an image on an imaging area of the solid-state image sensor; and
a signal processing section that processes the output signal of the solid-state image sensor to generate color information.

* * * * *